United States Patent
Yang

(10) Patent No.: US 11,011,486 B1
(45) Date of Patent: May 18, 2021

(54) BONDED SEMICONDUCTOR STRUCTURE AND METHOD FOR FORMING THE SAME

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/675,200

(22) Filed: Nov. 5, 2019

(51) Int. Cl.
*H01L 23/52* (2006.01)
*H01L 23/00* (2006.01)
*H01L 25/065* (2006.01)

(52) U.S. Cl.
CPC ............. *H01L 24/08* (2013.01); *H01L 24/03* (2013.01); *H01L 24/05* (2013.01); *H01L 24/29* (2013.01); *H01L 24/32* (2013.01); *H01L 25/0657* (2013.01); *H01L 2224/0311* (2013.01); *H01L 2224/05567* (2013.01); *H01L 2224/05576* (2013.01); *H01L 2224/05624* (2013.01); *H01L 2224/05647* (2013.01); *H01L 2224/05666* (2013.01); *H01L 2224/05681* (2013.01); *H01L 2224/05684* (2013.01); *H01L 2224/08147* (2013.01); *H01L 2224/2908* (2013.01); *H01L 2224/29083* (2013.01); *H01L 2224/29187* (2013.01); *H01L 2224/32145* (2013.01); *H01L 2924/059* (2013.01); *H01L 2924/05042* (2013.01); *H01L 2924/05442* (2013.01)

(58) Field of Classification Search
CPC ......... H01L 24/29; H01L 24/05; H01L 24/03; H01L 24/08; H01L 24/32; H01L 25/0657
USPC .......................................................... 257/777
See application file for complete search history.

(56) References Cited

U.S. PATENT DOCUMENTS

| | | | |
|---|---|---|---|
| 8,159,060 B2 | 4/2012 | Barth | |
| 8,860,229 B1 | 10/2014 | Lin | |
| 9,142,517 B2 | 9/2015 | Liu | |
| 9,257,399 B2* | 2/2016 | Kuang | ................. H01L 25/043 |
| 9,461,007 B2* | 10/2016 | Chun | ..................... H01L 24/05 |
| 9,520,361 B2* | 12/2016 | Kang | ................ H01L 27/14621 |
| 9,583,465 B1 | 2/2017 | Cheng | |
| 9,704,904 B2 | 7/2017 | Lai | |
| 9,960,142 B2 | 5/2018 | Chen | |
| 2015/0357296 A1 | 12/2015 | Liu | |

* cited by examiner

*Primary Examiner* — Luan C Thai
(74) *Attorney, Agent, or Firm* — Winston Hsu

(57) ABSTRACT

A semiconductor structure is disclosed, including a substrate, an insulating layer on the substrate, a barrier layer on the insulating layer, a bonding dielectric layer on the barrier layer, and a bonding pad extending through the insulating layer, the barrier layer and the bonding dielectric layer. A top surface of the bonding pad exposed from the bonding dielectric layer for bonding to another bonding pad on another substrate. A liner on a bottom surface of the bonding pad directly contacts the substrate.

18 Claims, 5 Drawing Sheets

BONDED SEMICONDUCTOR STRUCTURE AND METHOD FOR FORMING THE SAME

BACKGROUND OF THE INVENTION

1. Field of the Invention

The invention relates to a bonded semiconductor structure and a method for forming the same, and more particularly, to a bonded semiconductor structure and a method for forming the same using hybrid bonding.

2. Description of the Prior Art

In advanced semiconductor industry, integration density of various electronics components has been continuously improved by reducing minimum feature size, which allows more electronics components to be integrated into given areas. These smaller electronic components also require smaller packages that utilize less area than packages of the past, in some applications.

Three dimensional integrated circuits (3DICs) are recently development in which multiple semiconductor dies are stacked upon one another, such as package-on-package (PoP) and system-in-package (SiP) packaging techniques. 3DICs provide improved integration density and other advantages such as faster speeds and higher bandwidth because of the decreased length of interconnects between the stacked dies.

Bonding of multiple semiconductor dies of 3DICs may be achieved by placing dies over dies on a wafer level and forming a bonding interface between the dies by a hybrid bonding process. Hybrid bonding (also known as "metal/dielectric hybrid bonding") can be a direct bonding technology (e.g., forming bonding between surfaces without using intermediate layers, such as solder or adhesives), which obtains metal-to-metal bonding and dielectric-to-dielectric bonding simultaneously.

However, there are many challenges related to 3DICs. For example, conductive material such as copper (Cu) for forming the bonding pads may diffuse in the plane of the bonding interface, which may cause electrical shorts and reliability problems in the bonded structure.

SUMMARY OF THE INVENTION

In light of the above, the present invention is directed to provide a semiconductor structure for hybrid bonding by which a high adhesion strength and containment of interfacial impurity diffusion may be achieved.

According to an embodiment of the present invention, a semiconductor structure is disclosed, which includes a substrate, an insulating layer disposed on the substrate, a barrier layer disposed on the insulating layer, a bonding dielectric layer disposed on the barrier layer, and a bonding pad extending through the bonding dielectric layer, the barrier layer and the insulating layer and having a top surface exposed from the bonding dielectric layer for bonding to another bonding pad of another semiconductor structure, wherein the bonding pad comprises a conductive material and a liner lining the conductive material, and the liner on a bottom surface of the conductive material directly contacts the substrate.

According to another embodiment of the present invention, a bonded semiconductor structure is disclosed, which includes a first substrate and a second substrate disposed on the first substrate, a first insulating layer and a first bonding dielectric layer between the first substrate and the second substrate, a first barrier layer between the first insulating layer and the first bonding dielectric layer, a first bonding pad extending through the first bonding dielectric layer, the first barrier layer and the first insulating layer, wherein the first bonding pad comprises a first conductive material and a first liner lining the first conductive material, and the first liner on a bottom surface of the first conductive material directly contacts the first substrate, a second bonding dielectric layer between the first bonding dielectric layer and the second substrate and being bonded to the first bonding dielectric layer, and a second bonding pad in the second bonding dielectric layer and being bonded to the first bonding pad.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

It should be readily understood that the meaning of "on", "above", "over" and the like in the present disclosure should be interpreted in the broadest manner such that these terms not only means "directly on something" but also includes the meaning of "on something with an intermediate feature or a layer therebetween".

Furthermore, spatially relative terms, such as "beneath", "below", "under", "lower", "above", "upper", "on", "over" and the like may be used herein to describe one element or feature's spatial relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

Please refer to FIG. 1 to FIG. 4, which are schematic cross-sectional drawings illustrating a sequential process flow for forming a semiconductor structure 1 according to an embodiment of the present invention.

Figure 1:
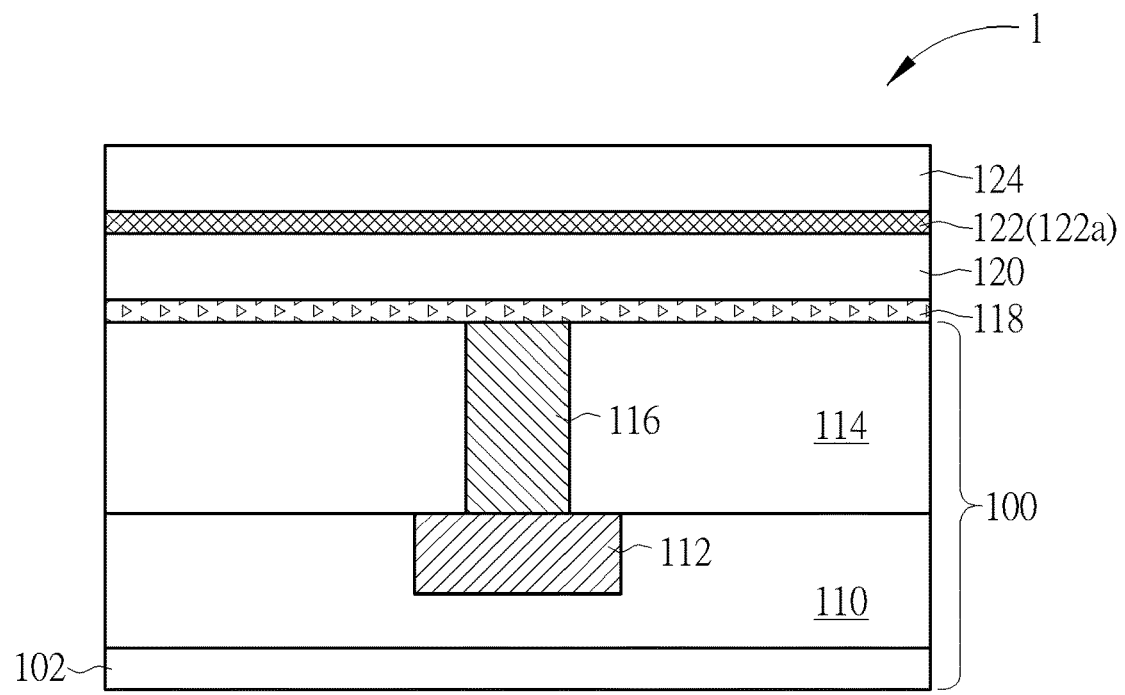
FIG. 1 to FIG. 4 are schematic cross-sectional drawings illustrating a sequential process flow for forming a semiconductor structure according to an embodiment of the present invention.

As shown in FIG. 1, a substrate 100 is provided. An etching stop layer 118, an insulating layer 120, a barrier layer 122 and a bonding dielectric layer 124 are successively disposed on the substrate 100 and extend across the entire surface of the substrate 100.

The substrate 100 may be a partially processed semiconductor wafer. The substrate 100 may include multiple material layers having semiconductor devices and/or interconnecting structures formed therein. As shown in FIG. 1, the substrate 100 may include a semiconductor substrate 102, such as a silicon substrate, a silicon-on-insulator (SOI) substrate, germanium-on-insulator (GOI) substrate, or a Group III-V semiconductor substrate, but not limited thereto. The semiconductor substrate 102 may comprise large numbers and types of devices formed therein, such as memory, logic circuits, amplifiers, inverters, transistors, and the like, which are not shown in the diagrams for the sake of simplification.

Metallization structures comprising multilevel dielectric layers and conductive layers may be formed on the semiconductor substrate 102. For the sake of simplification, only the two top-most dielectric layers 110 and 114 and the conductive structures 112 and 116 are shown. The dielectric layers 110 and 114 may respectively include a dielectric material selected from a group comprising silicon oxide ($SiO_2$), silicon oxynitride (SiON), silicon nitride (SiN), low-k dielectric materials such as fluorinated silica glass (FSG), silicon oxycarbide (SiCOH), spin on glass, porous low-k dielectric material, organic dielectric polymers, or a combination thereof, but not limited thereto.

The conductive structure 112 may be a conductive pad or an interconnecting structure to provide electrical access to the circuits of the semiconductor substrate 102. The conductive structure 116 may be a conductive via for electrically connecting the bonding pad 136 formed in later process (shown in FIG. 4) to the conductive structure 112. The conductive structures 112 and 116 may comprise metal such as tungsten (W), copper (Cu), aluminum (Al), or other suitable metals, but not limited thereto. According to an embodiment, the conductive structures 112 and 116 comprise copper (Cu). The conductive structures 112 and 116 may be respectively lined by a liner (not shown).

The insulating layer 120 and the bonding dielectric layer 124 may be made of a same or different materials selected form, but not limited to, silicon oxide ($SiO_2$), silicon oxynitride (SiON), silicon nitride (SiN), or low-k dielectric materials such as fluorinated silica glass (FSG), silicon oxycarbide (SiCOH), spin on glass, porous low-k dielectric material, organic dielectric polymers, or a combination thereof. According to an embodiment, the insulating layer 120 and the bonding dielectric layer 124 are made of silicon oxide ($SiO_2$).

The etching stop layer 118 may protect the substrate 100 from being over-etched during the etching process for forming the bonding pad 136. The etching stop layer 118 may comprise dielectric material having an adequate etching selectivity with respect to the insulating layer 120, such as silicon nitride (SiN), silicon carbide (SiC), silicon carbon nitride (SiCN) or silicon oxynitride (SiON), and a combination thereof, but not limited thereto. According to an embodiment, the etching stop layer 118 comprises silicon carbide (SiC).

The barrier layer 122 sandwiched between the insulating layer 120 and the bonding dielectric layer 124 may comprise a diffusion barrier layer 122a made of a dielectric material that blocks the diffusion of interfacial impurity. The diffusion barrier layer 122a may comprise silicon nitride (SiN), silicon carbide (SiC), silicon carbon nitride (SiCN) or silicon oxynitride (SiON), and a combination thereof, but not limited thereto. According to an embodiment, the diffusion barrier layer 122a comprises silicon nitride (SiN).

Figure 2:
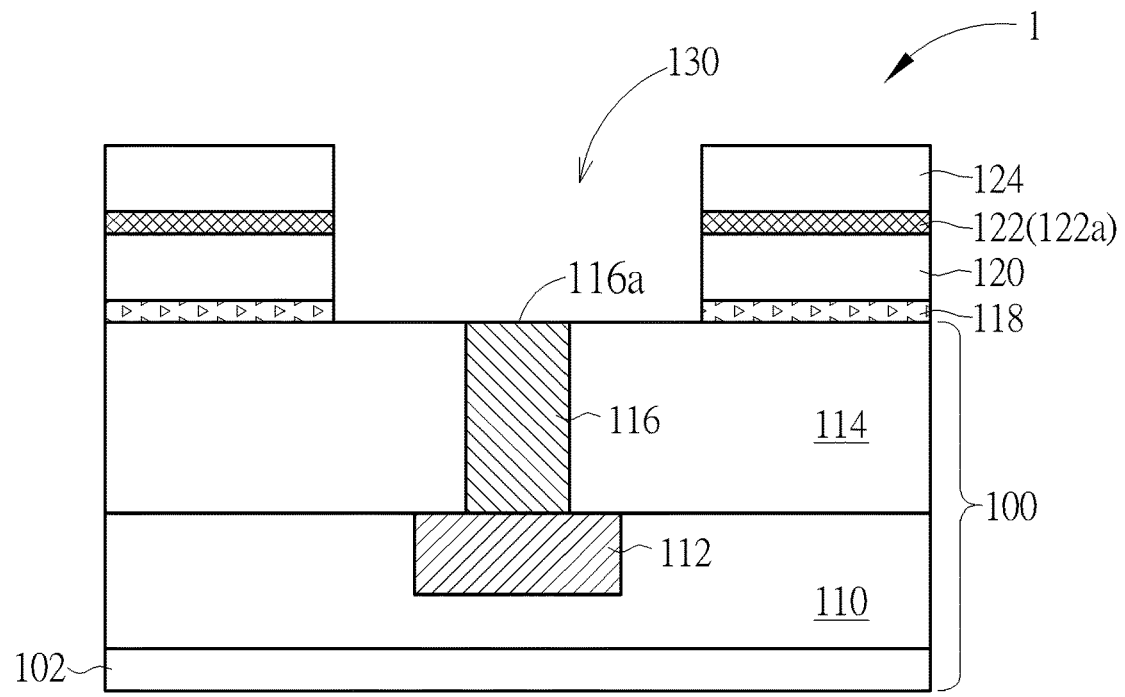

Please refer to FIG. 2. Subsequently, a patterning process such as a photolithography-etching process is performed to remove portions of the bonding dielectric layer 124, the barrier layer 122, the insulating layer 120 and the etching stop layer 118, thereby forming a recess 130 exposing a top surface 116a of the conductive structure 116 and a portion of the dielectric layer 114 beside the conductive structure 116.

Figure 3:
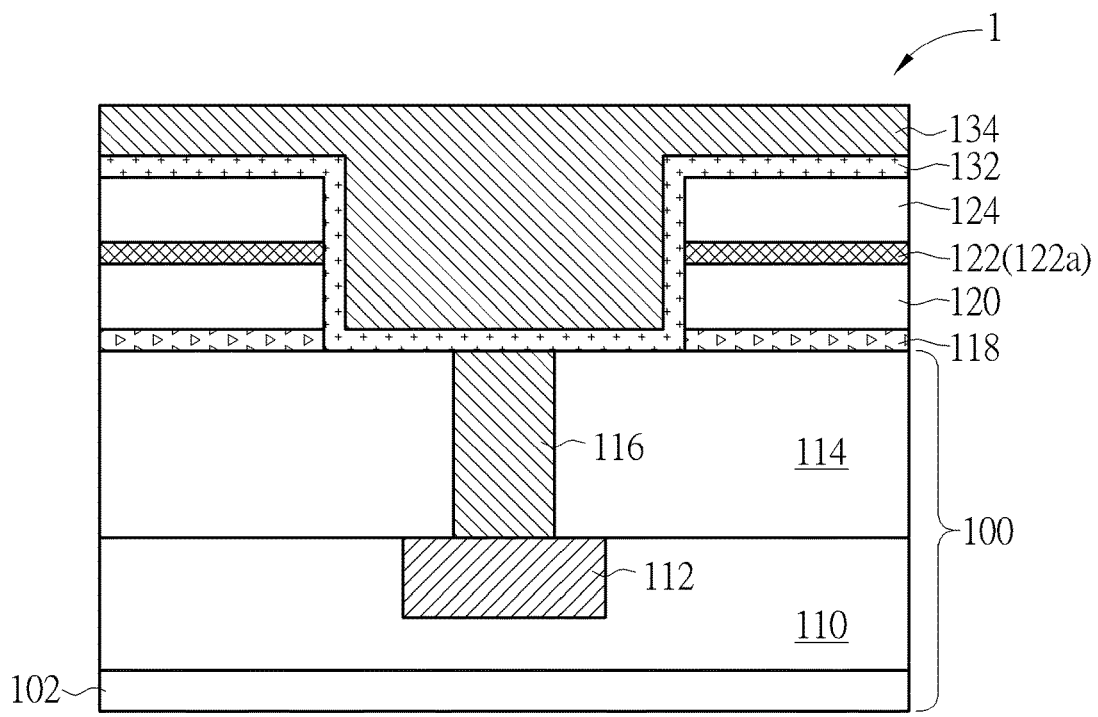

Please refer to FIG. 3. Subsequently, a liner 132 is conformally formed on the upper surface of the dielectric layer 124, the sidewall and bottom surface of the recess 130. After that, a conductive material layer 134 is deposited on the dielectric layer 124 in a blanket manner, completely covering the substrate 100 and filling up the recess 130. The liner 132 may comprise single or multiple layers made of tungsten nitride (WN), titanium (Ti), titanium nitride (TiN), tantalum (Ta), tantalum nitride (TaN), or a combination thereof, but not limited thereto. The conductive material layer 134 may comprise metal such as tungsten (W), copper (Cu), aluminum (Al), or other suitable metals, but not limited thereto. According to an embodiment, the conductive material layer 134 comprises copper (Cu). The liner 132 may improve adhesion between the conductive material 134 and the dielectric layers 114, 120, 124. The liner 132 also serves as a barrier layer for blocking the metal of the conductive material 134 from diffusing into the dielectric layers 114, 120, 124. A seed layer (not shown) may be conformally formed on the liner 132 before depositing the conductive material layer 134.

Figure 4:
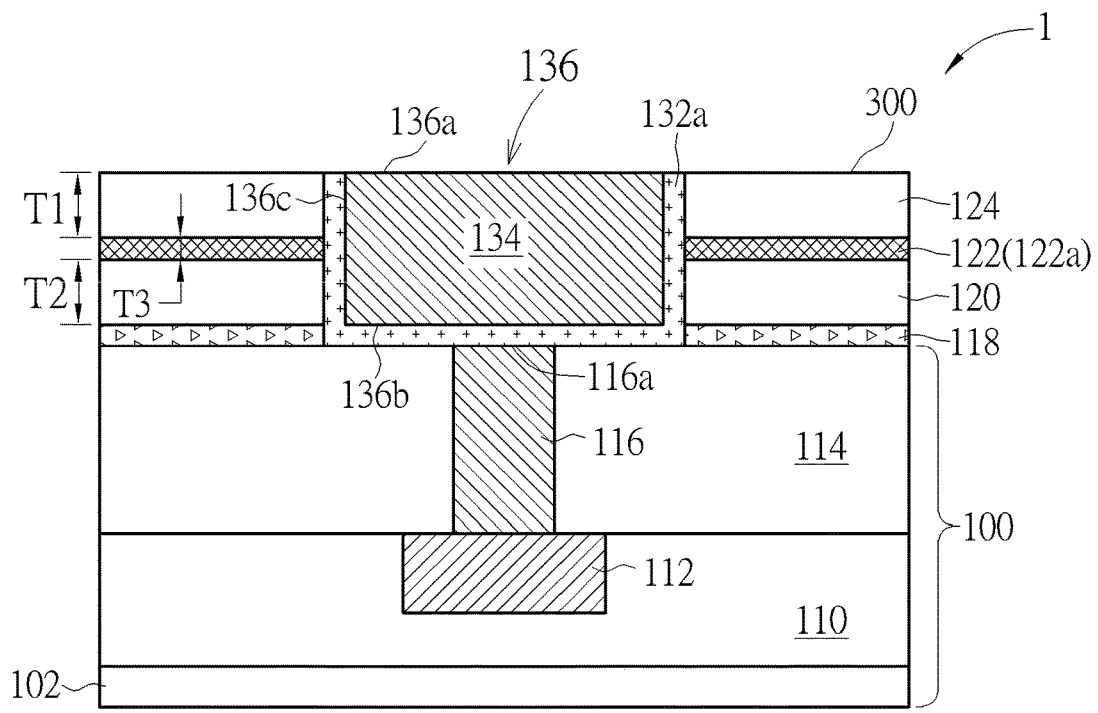

Please refer to FIG. 4. Subsequently, a chemical mechanical polishing (CMP) process or an etching process may be performed to remove the liner 132 and the conductive material layer 134 outside the recess 130. The liner 132a and the conductive material layer 134 remaining in the recess 130 form a bonding pad 136. The top surface 136a of the bonding pad 136 is exposed from the upper surface of the bonding dielectric layer 124 for hybrid bonding to another bonding pad of another semiconductor structure.

A portion of the bonding dielectric layer 124 may be removed during the CMP process or the etching process. The remaining thickness T1 of the bonding dielectric layer 124 may be equal or smaller than the thickness T2 of the insulating layer 120. According to an embodiment, the thickness T1 of the bonding dielectric layer 124 may range from 50 to 10000 angstroms (Å), but not limited thereto; the thickness T2 of the insulating layer 120 may range from 50 to 10000 angstroms but not limited thereto. The thickness T3 of the barrier layer 122 may range from 5 to 1000 angstroms, but not limited thereto.

As shown in FIG. 4, according to the embodiment, the bonding pad 136 is vertically disposed on the conductive structure 116. The liner 132a on the bottom surface 136b of the bonding pad 136 directly covers the top surface 116a of the conductive structure 116 and a top surface of the dielectric layer 114 beside the conductive structure 116. The liner 132a on the sidewall 136c of the bonding pad 136 directly contacts the insulating layer 120, the bonding dielectric layer 124, the barrier layer 122 and the etching stop layer 118. The bottom surface 136b of the bonding pad 136 may be flush with a bottom surface of the etching stop layer 118, as shown in FIG. 4. In other embodiments, the recess 130 for forming the bonding pad 136 may extend into a portion of the dielectric layer 114, and therefore the bottom surface 136b of the bonding pad 136 may be lower than the bottom surface of the etching stop layer 118.

Figure 5:
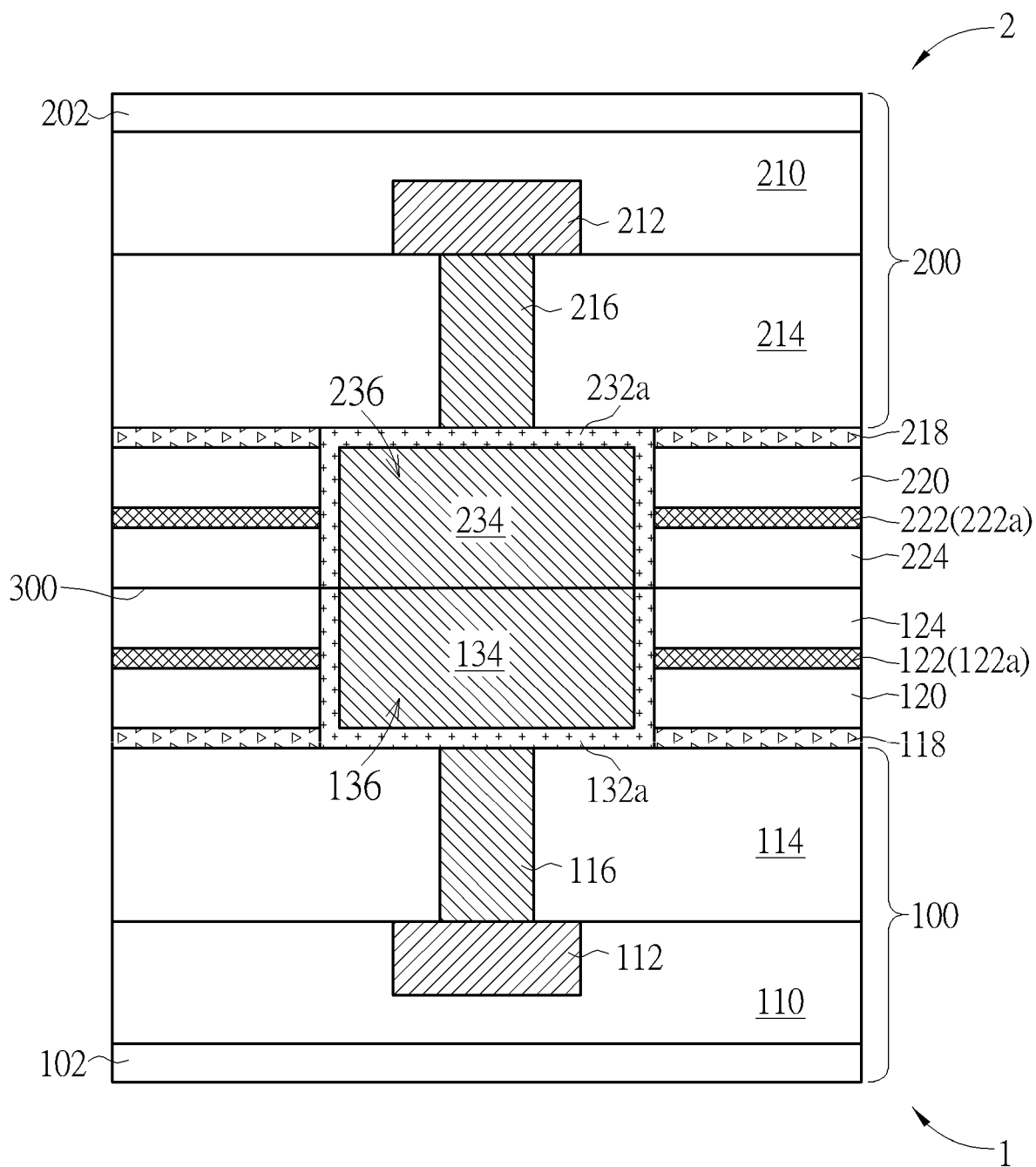
FIG. 5, FIG. 6 and FIG. 7 are schematic cross-sectional drawings illustrating various hybrid bonded semiconductor structures according to some embodiments of the present invention.

Please refer to FIG. 5, which is a schematic cross-sectional diagram illustrating a hybrid bonded structure having a semiconductor structure 1 bonded to another semiconductor structure 2 according to an embodiment of the present invention. The semiconductor structure 1 and the semiconductor structure 2 may be respectively prepared by the process illustrated in FIG. 1 to FIG. 4. For example, the semiconductor structure 1 may comprise a substrate 100 (first substrate) having a semiconductor substrate 102 and multilevel dielectric layers and conductive layers such as the dielectric layers 110 and 114 and the conductive structure 116 (first conductive structure) and a conductive structure 112 formed on the semiconductor substrate 102. An etching stop layer 118 (first etching stop layer), an insulating layer 120 (first insulating layer), a barrier layer 122 (first barrier layer) and a bonding dielectric layer 124 (first bonding dielectric layer) are successively formed on the substrate 100. A bonding pad 136 (first bonding pad) is formed on the substrate 100 and extends through the insulating layer 120, the barrier layer 122, the bonding dielectric layer 124 and the etching stop layer 118 and directly connects the conductive structure 116. The liner 132a on the sidewall and bottom surface of the bonding pad 136 directly covers the top surface 116a of the conductive structure 116 and a top surface of the dielectric layer 114 besides the conductive structure 116.

Similarly, the semiconductor structure 2 may comprise a substrate 200 (second substrate) having a semiconductor substrate 202 and multilevel dielectric layers and conductive layers such as dielectric layers 210 and 214 and conductive structure 216 (second conductive structure) and conductive structure 212 formed on the semiconductor substrate 202. An etching stop layer 218 (second etching stop layer), an insulating layer 220 (second insulating layer), a barrier layer 222 (second barrier layer) and a bonding dielectric layer 224 (second bonding dielectric layer) are successively formed on the substrate 200. A bonding pad 236 (second bonding pad) is formed on the substrate 200 and extends through the insulating layer 220, the barrier layer 222, the bonding dielectric layer 224 and the etching stop layer 218 and directly connects the conductive structure 216. The liner 232a on the sidewall and bottom surface of the bonding pad 236 directly covers the top surface 116a of the conductive structure 116 and the top surface of the dielectric layer 114 besides the conductive structure 116.

In the embodiment shown in FIG. 5, the semiconductor structure 1 and the semiconductor structure 2 are bonded together by placing the semiconductor structure 2 upside-down upon the semiconductor structure 1, making the substrate 200 of the semiconductor structure 2 upon the substrate 100 of the semiconductor structure 1, allowing the interface between the bonding dielectric layer 124 and the bonding dielectric layer 224 and the interface between the bonding pad 136 and the bonding pad 236. Afterward, a thermal treatment or other suitable bonding process may be carried out to form dielectric-to-dielectric bonding between the bonding dielectric layer 124 and the bonding dielectric layer 224 and metal-to-metal bonding between the bonding pad 136 and the bonding pad 236, thereby obtaining the hybrid bonding interface 300 between the semiconductor structure 1 and the semiconductor structure 2.

In some embodiments, due to process variation such as miss-alignment between the bonding pad 136 and the bonding pad 236, a portion of the conductive material 134 of the bonding pad 136 may be directly exposed to the bonding dielectric layer 224 and/or a portion of the conductive material 234 may be directly exposed to the bonding dielectric layer 124. The barrier layers 122 and 222 horizontally extending across the entire surface of the substrates 100 and 200 may effectively contain the diffusion of the conductive material 134 or the conductive material 234 into the substrates 100 and 200, and thereby device failure due to diffused metal may be reduced.

Figure 6:
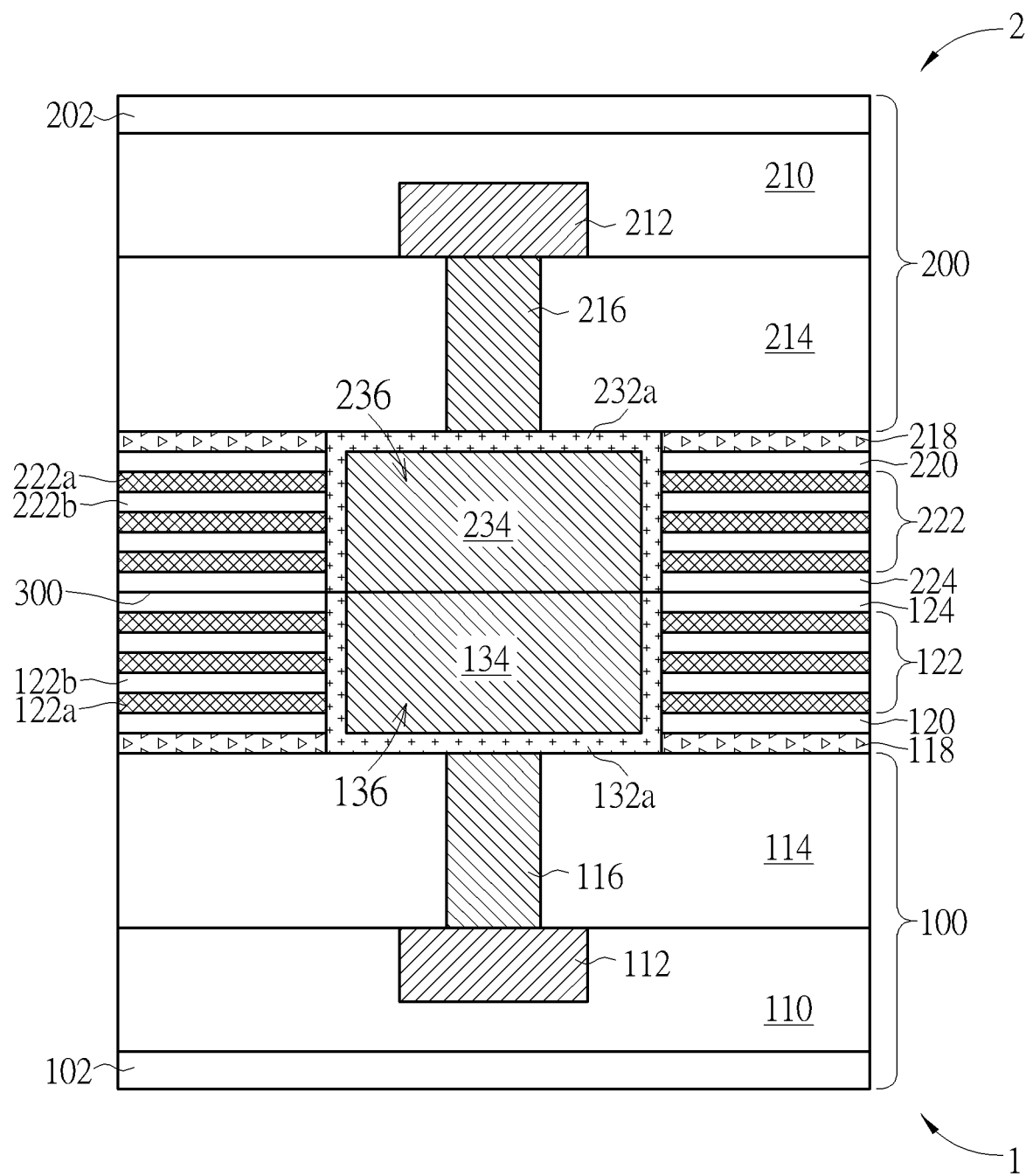

Please refer to FIG. 6, which is a schematic cross-sectional diagram illustrating a hybrid bonded structures according to another embodiment of the present invention. For the sake of simplicity, like reference numerals are used to refer to the same material layers or process steps described previously. In the embodiment shown in FIG. 6, the barrier layer 122 may comprise multiple layers. For example, the barrier layer 122 may comprise multiple diffusion barrier layers 122a and dielectric layers 122b stacking alternatively on the insulating layer 120. Likewise, the barrier layer 222 may comprise multiple diffusion barrier layers 222a and dielectric layers 222b stacking alternatively on the insulating layer 220. The dielectric layers 122b and 222b may comprise a dielectric material such as silicon oxide ($SiO_2$), silicon oxynitride (SiON), silicon nitride (SiN), or low-k dielectric materials such as fluorinated silica glass (FSG), silicon oxycarbide (SiCOH), spin on glass, porous low-k dielectric material, organic dielectric polymers, or a combination thereof, but not limited thereto. According to an embodiment, the dielectric layers 122b and 222b, the insulating layer 120 and the insulating layer 220 comprise a same dielectric material, such as silicon oxide (SiO2). Multiple diffusion barrier layers may provide more protection to the substrates 100 and the substrate 200 from being contaminated by the diffused metal.

Figure 7:
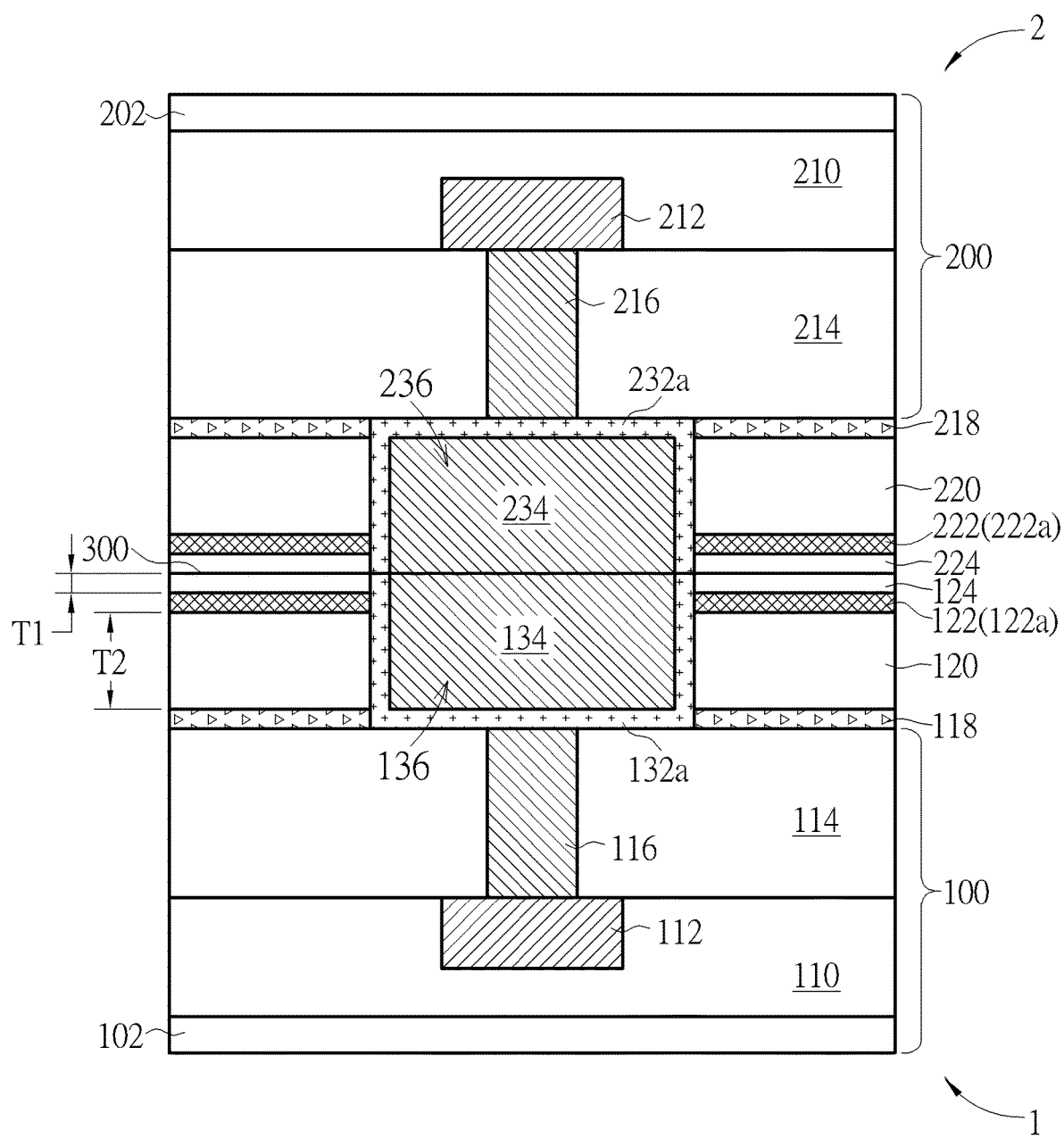

Please refer to FIG. 7, which is a schematic cross-sectional diagram illustrating a hybrid bonded structures according to still another embodiment of the present invention. For the sake of simplicity, like reference numerals are used to refer to the same material layers or process steps described previously. In the embodiment shown in FIG. 7, the barrier layer 122 and the barrier layer 222 may be formed much closer to the hybrid bonding interface 300 than to the surface of the substrate 100 and the substrate 200. In this way, when metal diffusion occurs, the diffused metal may be contained within a smaller region near the hybrid bonding interface 300. According to an embodiment, for example, the thickness T1 of the bonding dielectric layer 124 may range from 50 to 10000 angstroms, but not limited thereto. The thickness T2 of the insulating layer 120 may range from 50 to 10000 angstroms, but not limited thereto. The thickness T1 of the bonding dielectric layer 124 may be approximately one-tenth of the thickness T2 of the insulating layer 120.

Overall, one feature of the present invention is that by forming the diffusion barrier layer extending across the bonded substrate, metal diffusion near the bonding interface of a hybrid bonded semiconductor structure may be effectively controlled and the risk of the diffused metal diffusing into the circuit of the semiconductor structure may be reduced. Device failure due to metal diffusion may be prevented. Furthermore, bonding strength of the bonded semiconductor structure may also be improved by forming the oxide-to-oxide and metal-to-metal hybrid bonding interface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   an insulating layer on the substrate;
   a barrier layer on the insulating layer, wherein the barrier layer comprises multiple diffusion barrier layers and at least a dielectric layer stacking alternatively on the insulating layer;
   a bonding dielectric layer on the barrier layer; and
   a bonding pad extending through the bonding dielectric layer, the barrier layer and the insulating layer and having a top surface exposed from the bonding dielectric layer for bonding to another bonding pad of another semiconductor structure, wherein the bonding pad comprises a conductive material and a liner lining the conductive material, and the liner on a bottom surface of the conductive material directly contacts the substrate.

2. The semiconductor structure according to claim 1, further comprising a conductive structure formed in the substrate, wherein the liner on the bottom surface of the bonding pad directly contacts a top surface of the conductive structure.

3. The semiconductor structure according to claim 1, wherein a thickness of the bonding dielectric layer on the barrier layer is smaller than a thickness of the insulating layer under the barrier layer.

4. The semiconductor structure according to claim 1, wherein the liner on a sidewall of the bonding pad directly contacts the insulating layer, the bonding dielectric layer and the barrier layer.

5. The semiconductor structure according to claim 1, wherein the bonding dielectric layer comprises silicon oxide (SiO2).

6. The semiconductor structure according to claim 1, wherein the diffusion barrier layers respectively comprise silicon nitride (SiN) or silicon oxyniride (SiON).

7. The semiconductor structure according to claim 1, wherein the insulating layer and the dielectric layer comprise silicon oxide (SiO2), silicon oxynitride (SiON), or silicon nitride (SiN).

8. The semiconductor structure according to claim 1, further comprising an etching stop layer intervening between the substrate and the insulating layer, wherein the bottom surface of the bonding pad is flush with or lower than a bottom surface of the etching stop layer.

9. The semiconductor structure according to claim 1, wherein the etching stop layer comprises silicon carbide (SiC).

10. A bonded semiconductor structure, comprising:
    a first substrate and a second substrate disposed on the first substrate;
    a first insulating layer and a first bonding dielectric layer between the first substrate and the second substrate;
    a first barrier layer between the first insulating layer and the first bonding dielectric layer, wherein the first barrier layer comprises multiple first diffusion barrier layers and at least a first dielectric layer alternatively arranged between the first insulating layer and the first bonding dielectric layer;
    a first bonding pad extending through the first bonding dielectric layer, the first barrier layer and the first insulating layer, wherein the first bonding pad comprises a first conductive material and a first liner lining the first conductive material, and the first liner on a bottom surface of the first conductive material directly contacts the first substrate;
    a second bonding dielectric layer between the first bonding dielectric layer and the second substrate and being bonded to the first bonding dielectric layer; and
    a second bonding pad in the second bonding dielectric layer and being bonded to the first bonding pad.

11. The bonded semiconductor structure according to claim 10, further comprising a first conductive structure formed in the first substrate, wherein the first liner on the bottom surface of the first bonding pad directly contacts a top surface of the first conductive structure.

12. The bonded semiconductor structure according to claim 10, wherein the first bonding dielectric layer and the second bonding dielectric layer comprise silicon oxide (SiO2).

13. The bonded semiconductor structure according to claim 10, wherein the first diffusion barrier layers respectively comprise silicon nitride (SiN) or silicon oxynitride (SiON).

14. The bonded semiconductor structure according to claim 10, further comprising an etching stop layer intervening between the first substrate and the first insulating layer, wherein the bottom surface of the first bonding pad is flush with or lower than a bottom surface of the etching stop layer.

15. The bonded semiconductor structure according to claim 10, further comprising:
    a second insulating layer between the second bonding dielectric layer and the second substrate;
    a second barrier layer between the second insulating layer and the second bonding dielectric layer, wherein the second barrier layer comprises multiple second diffusion barrier layers and at least a second dielectric layer alternatively arranged between the second insulating layer and the second bonding dielectric layer; and
    a second conductive structure formed in the second substrate and connected to the second bonding pad, wherein a second liner on the surface of second bonding pad directly contacts the second substrate.

16. The bonded semiconductor structure according to claim 10, wherein a thickness of the first bonding dielectric layer on the first barrier layer is smaller than a thickness of the first insulating layer under the first barrier layer.

17. The bonded semiconductor structure according to claim 10, wherein the first liner on a sidewall of the first bonding pad directly contacts the first insulating layer, the first bonding dielectric layer and the first barrier layer.

18. The bonded semiconductor structure according to claim 10, wherein the second bonding pad is not in direct contact with the first barrier layer.

\* \* \* \* \*